United States Patent
Harley et al.

(10) Patent No.: US 9,087,939 B2
(45) Date of Patent: *Jul. 21, 2015

(54) SOLAR CELL CONTACT FORMATION USING LASER ABLATION

(71) Applicant: SUNPOWER CORPORATION, San Jose, CA (US)

(72) Inventors: Gabriel Harley, Mountain View, CA (US); David D. Smith, Campbell, CA (US); Peter John Cousins, Menlo Park, CA (US)

(73) Assignee: SunPower Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/334,401

(22) Filed: Jul. 17, 2014

(65) Prior Publication Data

US 2014/0326308 A1 Nov. 6, 2014

Related U.S. Application Data

(63) Continuation of application No. 13/669,147, filed on Nov. 5, 2012, now Pat. No. 8,785,236, which is a continuation of application No. 12/895,437, filed on Sep. 30, 2010, now Pat. No. 8,324,015.

(60) Provisional application No. 61/265,652, filed on Dec. 1, 2009.

(51) Int. Cl.
| H01L 31/00 | (2006.01) |
| H01L 31/0224 | (2006.01) |
| H01L 31/068 | (2012.01) |

(52) U.S. Cl.
CPC .... *H01L 31/022441* (2013.01); *H01L 31/0682* (2013.01); *Y02E 10/547* (2013.01)

(58) Field of Classification Search
CPC ............... Y02E 10/547; Y02E 10/546; H01L 31/022441; H01L 31/0682; H01L 31/022425; H01L 31/0527
USPC .............................. 136/252, 256, 258; 438/98
See application file for complete search history.

(56) References Cited

U.S. PATENT DOCUMENTS

| 5,738,731 A | 4/1998 | Shindo et al. |
| 7,468,485 B1 * | 12/2008 | Swanson ...................... 136/243 |
| 8,324,015 B2 * | 12/2012 | Harley et al. .................. 438/98 |
| 8,785,236 B2 * | 7/2014 | Harley et al. .................. 438/98 |
| 2006/0223284 A1 | 10/2006 | Li et al. |

(Continued)

FOREIGN PATENT DOCUMENTS

| CN | 101331614 A | 12/2008 |
| JP | 1990143569 A | 1/1990 |

(Continued)

*Primary Examiner* — Khiem D Nguyen
(74) *Attorney, Agent, or Firm* — Okamoto & Benedicto LLP

(57) ABSTRACT

The formation of solar cell contacts using a laser is described. A method of fabricating a back-contact solar cell includes forming a poly-crystalline material layer above a single-crystalline substrate. The method also includes forming a dielectric material stack above the poly-crystalline material layer. The method also includes forming, by laser ablation, a plurality of contacts holes in the dielectric material stack, each of the contact holes exposing a portion of the poly-crystalline material layer; and forming conductive contacts in the plurality of contact holes.

13 Claims, 7 Drawing Sheets

(56) References Cited

U.S. PATENT DOCUMENTS

| | | |
|---|---|---|
| 2007/0137692 A1* | 6/2007 | Carlson .................. 136/252 |
| 2007/0176845 A1* | 8/2007 | Yamazaki et al. ............ 343/895 |
| 2009/0120493 A1* | 5/2009 | Sinha ..................... 136/255 |
| 2009/0188553 A1 | 7/2009 | Dubin |
| 2009/0239331 A1 | 9/2009 | Xu et al. |
| 2009/0308457 A1* | 12/2009 | Smith ..................... 136/261 |

FOREIGN PATENT DOCUMENTS

| | | |
|---|---|---|
| JP | 2008533730 A | 8/2008 |
| WO | 2007/126441 A2 | 11/2007 |

* cited by examiner

SOLAR CELL CONTACT FORMATION USING LASER ABLATION

CROSS REFERENCE TO RELATED APPLICATIONS

This application is a continuation of U.S. application Ser. No. 13/669,147, filed Nov. 5, 2012, now U.S. Pat. No. 8,785,236, which is a continuation of U.S. application Ser. No. 12/895,437, filed Sep. 30, 2010, now U.S. Pat. No. 8,324,015, which claims the benefit of U.S. Provisional Application No. 61/265,652, filed Dec. 1, 2009. The just mentioned disclosures are hereby incorporated by reference in their entirety.

STATEMENT REGARDING FEDERALLY SPONSORED RESEARCH OR DEVELOPMENT

The invention described herein was made with Governmental support under contract number DE-FC36-07G017043 awarded by the United States Department of Energy. The Government may have certain rights in the invention.

TECHNICAL FIELD

Embodiments of the present invention are in the field of renewable energy and, in particular, the formation of single-step damage free solar cell contact openings using a laser.

BACKGROUND

Metal contact formation to electrically active areas in semiconductor and solar industries often involves a removal of dielectric material(s) (e.g., an oxide or nitride material), which may exist to electrically isolate or passivate certain active areas. Commonly practiced methods may require several process operations, such as deposition of a mask layer, selective etching of dielectric layer(s), and removal of a mask, or laser with subsequent etch or anneal.

BRIEF DESCRIPTION OF THE DRAWINGS

FIG. 2B' illustrates a cross-sectional view of an alternative stage in the fabrication of a back-contact solar cell corresponding to an operation of the flowchart of FIG. 1, in accordance with an embodiment of the present invention.

DETAILED DESCRIPTION

Figure 1:
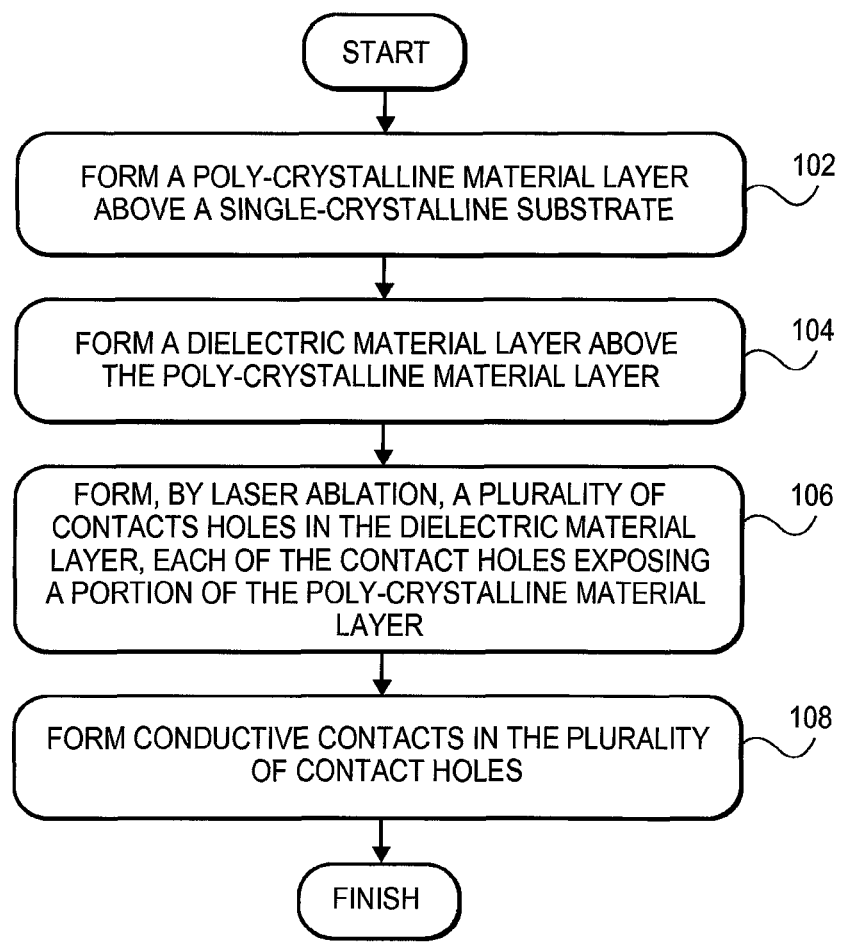
FIG. 1 illustrates a flowchart representing operations in a method of fabricating a back-contact solar cell, in accordance with an embodiment of the present invention.

The formation of solar cell contact openings using a laser is described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithographic techniques, are not described in detail in order to not unnecessarily obscure embodiments of the present invention. Furthermore, it is to be understood that the various embodiments shown in the Figures are illustrative representations and are not necessarily drawn to scale.

Disclosed herein are methods of fabricating back-contact solar cells. In one embodiment, a method includes forming a poly-crystalline material layer above a single-crystalline substrate. A dielectric material stack is formed above the poly-crystalline material layer. A plurality of contacts holes is formed in the dielectric material stack by laser ablation, each of the contact holes exposing a portion of the poly-crystalline material layer. Conductive contacts are formed in the plurality of contact holes. In one embodiment, a method includes forming a poly-crystalline material layer above a single-crystalline substrate. A dielectric material stack is formed above the poly-crystalline material layer. A recast poly signature is formed in the poly-crystalline material layer. A plurality of conductive contacts is formed in the dielectric material stack and coupled directly to a portion of the poly-crystalline material layer, one of the conductive contacts in alignment with the recast poly signature. It is to be understood that embodiments of the present invention need not be limited to the formation of back-side contacts, but could be used to form front-side contacts instead or as well.

Also disclosed herein are back-contact solar cells. In one embodiment, a back-contact solar cell includes a poly-crystalline material layer disposed above a single-crystalline substrate. A dielectric material stack is disposed above the poly-crystalline material layer. A plurality of conductive contacts is disposed in the dielectric material stack and coupled directly to a portion of the poly-crystalline material layer. A recast poly signature is disposed in the poly-crystalline material layer and in alignment with one of the plurality of conductive contacts.

In accordance with an embodiment of the present invention, contact formation is simplified and an associated cost of manufacture is reduced through reduction of consumables used, reduction of capital expenditure, and reduction of complexity. In one embodiment, contact formation for a solar cell includes contact formation in a dielectric layer by a direct-fire laser approach. Such an approach may otherwise be detrimental for single-crystal substrate based solar cells. However, in an embodiment, a poly-crystalline layer is included above a single-crystal substrate based solar cell. In that embodiment, any damage or melt is received and accommodated by the poly-crystalline layer instead of by the single-crystal substrate. Furthermore, in an embodiment, by using a poly-crystalline layer to receive a process of direct-fired contact formation, the formation of recombination sites in the single-crystal substrate is reduced or even essentially eliminated.

Conventional approaches to using laser treatment in the fabrication of contacts may often result in loss of efficiency over standard mask and etch techniques due to damage induced by lasers, which may increase contact resistance, may increase recombination at the emitter/metal junction, and may increase recombination an area known as the heat affected zone (HAZ). In an embodiment, such conventional approaches have lead to high emitter recombination, accentuating the traditional confounding problem of the need to minimize efficiency loss through contact recombination, while maintaining adequate contact coverage.

In accordance with an embodiment of the present invention, such laser-induced damage is minimized or essentially eliminated with use of highly advanced lasers with ultra short pulse lengths (e.g., in the femto second range) and short wavelength light (UV). However, in the case that such lasers are not available commercially or could be highly unstable with a myriad of industrial problems (e.g., optical coating degradation), then standard cell architectures may still exhibit electrical degradation with such laser configurations. As such, in another embodiment, to avoid any inherent electrical losses, commercially available and reliably-tested lasers are applied to semi-conductors without causing additional emitter recombination sites. In one embodiment, recombination in a solar cell is insensitive to typical optical and thermal damages induced by a laser since any damage remains within a poly-crystalline material layer instead on an underlying single-crystalline substrate. In an embodiment, a contact resistance of a solar cell surface remains low after contact formation by laser.

In an embodiment, formation of a dielectric or passivation layer in combination with a poly-crystalline material layer is tuned in a way to accommodate commercially available lasers which confine any laser damage to the poly-crystalline material layer or to the dielectric or passivation layer. For example, in an embodiment, a pico-second laser is used and the thermal penetration depth in silicon is limited to a submicron level. In a specific embodiment, an optical penetration depth in silicon during a laser-induced contact formation process is confined to a sub-micron level by using a laser wavelength less than approximately 1064 nanometers. In an embodiment, with the addition of an absorbing layer, such as a silicon nitride layer with the composition SixNy, total thermal and optical damage is confined within a poly-crystalline material layer so that high-efficiencies are achieved in a solar cell without the need for post-laser etching processes, or selective emitter formation. In an embodiment, a thin, e.g. less than approximately 15 nanometers, thermal oxide layer is grown to help mitigate thermal damage and promote ablation quality, optimizing a laser absorption process. In another embodiment, an appropriately tuned poly/oxide/nitride stack is used to accommodate longer pulse length (e.g., nano-second), or higher wavelength lasers (e.g., 1064 nanometers).

FIG. 1 illustrates a flowchart 100 representing operations in a method of fabricating a back-contact solar cell, in accordance with an embodiment of the present invention. FIGS. 2A-2D illustrate cross-sectional views of various stages in the fabrication of a back-contact solar cell corresponding to the operations of flowchart 100, in accordance with an embodiment of the present invention.

Figure 2A:
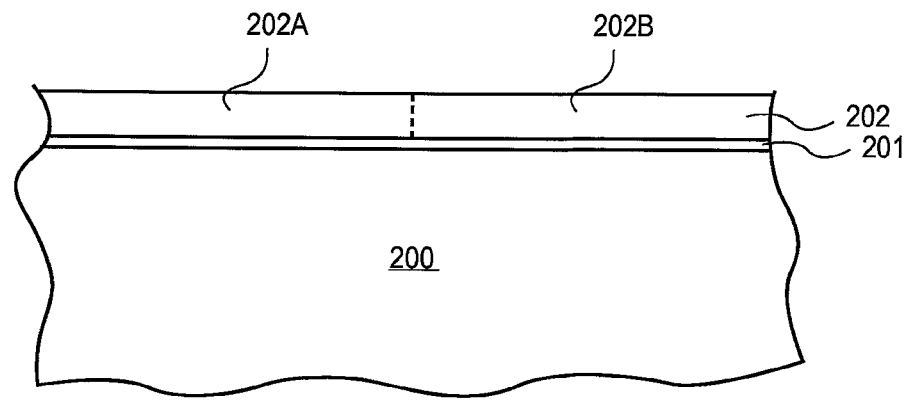
FIG. 2A illustrates a cross-sectional view of a stage in the fabrication of a back-contact solar cell corresponding to an operation of the flowchart of FIG. 1, in accordance with an embodiment of the present invention.

Referring to operation 102 of flowchart 100 and corresponding FIG. 2A, a method of fabricating a back-contact solar cell includes forming a poly-crystalline material layer 202 above a single-crystalline substrate 200. In accordance with an embodiment of the present invention, forming poly-crystalline material layer 202 above single-crystalline substrate 200 includes forming a layer of poly-crystalline silicon above a single-crystalline silicon substrate. In an embodiment, poly-crystalline material layer 202 is formed to a thickness of approximately 200 nanometers. In one embodiment, forming the layer of poly-crystalline silicon above the single-crystalline silicon substrate includes forming the layer of poly-crystalline silicon directly on a dielectric film 201, dielectric film 201 formed directly on single-crystalline silicon substrate 200, and forming both N-type and P-type doped regions 202A and 202B, respectively, in the layer of poly-crystalline silicon, as depicted in FIG. 2A. In one embodiment, the dielectric film 201 is a material such as, but not limited to, silicon dioxide ($SiO_2$), phosphosilicate glass (PSG), or borosilicate glass (BSG) having a thickness approximately in the range of 5 to 15 nanometers. In a specific embodiment, dielectric film 201 is composed of silicon dioxide and has a thickness approximately in the range of 1-2 nanometers. In a particular embodiment, dielectric film 201 is a tunnel oxide barrier layer film. In an alternative embodiment, instead of forming poly-crystalline material layer 202, a non-poly-crystalline absorbing material is formed instead such as, but not limited to an amorphous layer, a polymer layer, or a multi-crystalline layer. In another alternative embodiment, instead of using single-crystalline substrate 200, a multi-crystalline substrate is used in its place. In an embodiment, a trench or gap is present between the P and N diffused regions, e.g., in the case of one embodiment of a back-contact design.

Figure 2B:
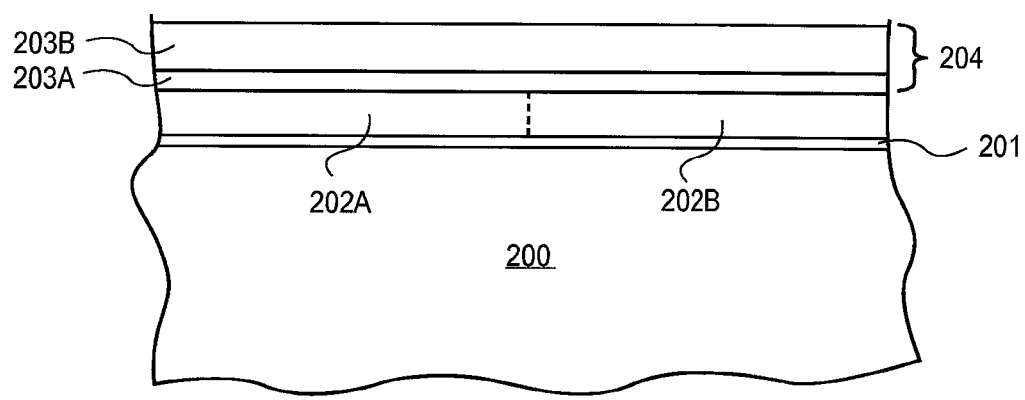
FIG. 2B illustrates a cross-sectional view of a stage in the fabrication of a back-contact solar cell corresponding to an operation of the flowchart of FIG. 1, in accordance with an embodiment of the present invention.
Figure 2B:
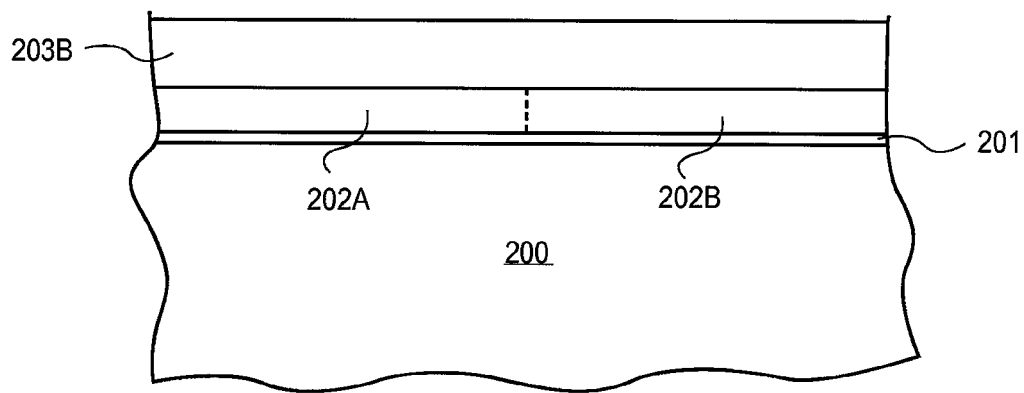

Referring to operation 104 of flowchart 100 and corresponding FIG. 2B, the method of fabricating a back-contact solar cell also includes forming a dielectric material stack 204 above poly-crystalline material layer 202. In accordance with an embodiment of the present invention, forming dielectric material stack 204 above poly-crystalline material layer 202 includes forming a silicon dioxide layer 203A directly on poly-crystalline material layer 202, and forming a silicon nitride layer 203B directly on silicon dioxide layer 203A. In an embodiment, forming silicon dioxide layer 203A includes forming to a thickness sufficiently low to not reflect back laser energy during a laser ablation process. However, in another embodiment, forming silicon dioxide layer 203A includes forming to a thickness sufficiently high to act as an ablation stop layer during a laser ablation process. In one embodiment, forming silicon dioxide layer 203A includes forming the layer to have a thickness approximately in the range of 1-50 nanometers. In a specific embodiment, forming silicon dioxide layer 203A includes forming the layer to have a thickness approximately in the range of 5-15 nanometers. However, in another embodiment, there is no layer 203A in the dielectric stack and only a silicon nitride layer 203B is included, as depicted in FIG. 2B'.

Figure 2C:
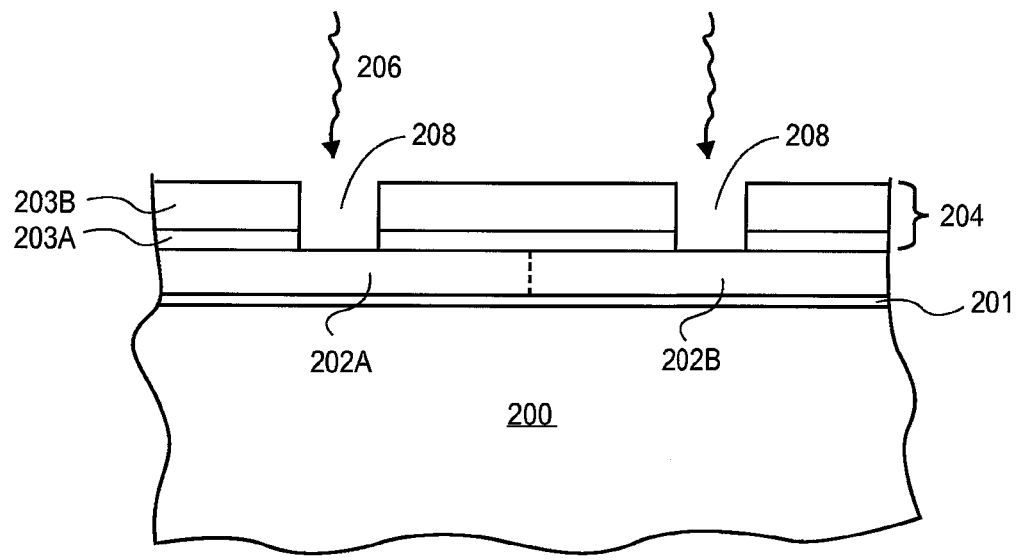
FIG. 2C illustrates a cross-sectional view of a stage in the fabrication of a back-contact solar cell corresponding to an operation of the flowchart of FIG. 1, in accordance with an embodiment of the present invention.

Referring to operation 106 of flowchart 100 and corresponding FIG. 2C, the method of fabricating a back-contact solar cell also includes forming, by laser ablation 206, a plurality of contacts holes 208 in dielectric material stack 204, each of the contact holes 208 exposing a portion of poly-crystalline material layer 202. In accordance with an embodiment of the present invention, forming the plurality of contact holes 208 is performed without the use of a patterned mask. In an embodiment, forming the plurality of contact holes 208 includes ablating with a laser having a wavelength approximately at, or less than, 1064 nanometers.

Figure 2D:
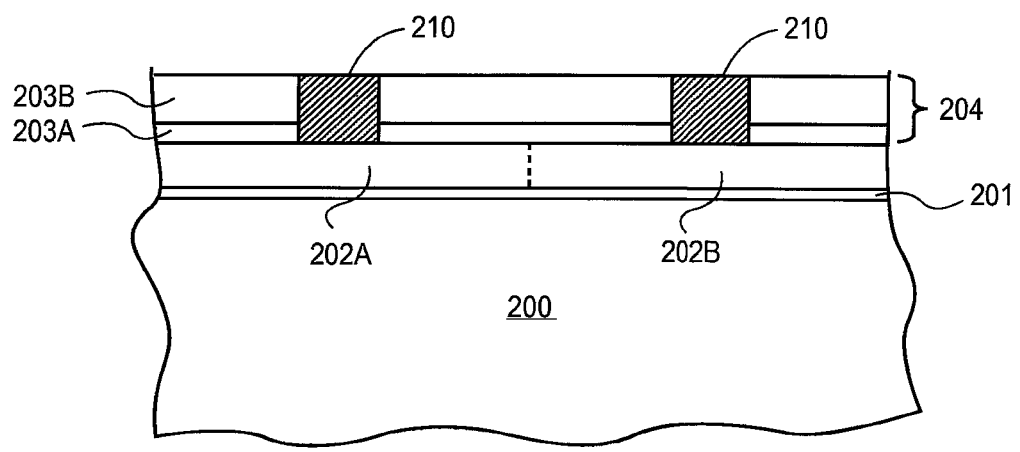
FIG. 2D illustrates a cross-sectional view of a stage in the fabrication of a back-contact solar cell corresponding to an operation of the flowchart of FIG. 1, in accordance with an embodiment of the present invention.

Referring to operation 108 of flowchart 100 and corresponding FIG. 2D, the method of fabricating a back-contact solar cell also includes forming conductive contacts 210 in the plurality of contact holes 208.

By applying a laser-induced contact formation process such as the process described above, certain signatures or features may be included in the resulting solar cell. For example, FIG. 3A illustrates a cross-sectional view of a back-contact solar cell, in accordance with an embodiment of the present invention.

Figure 3A:
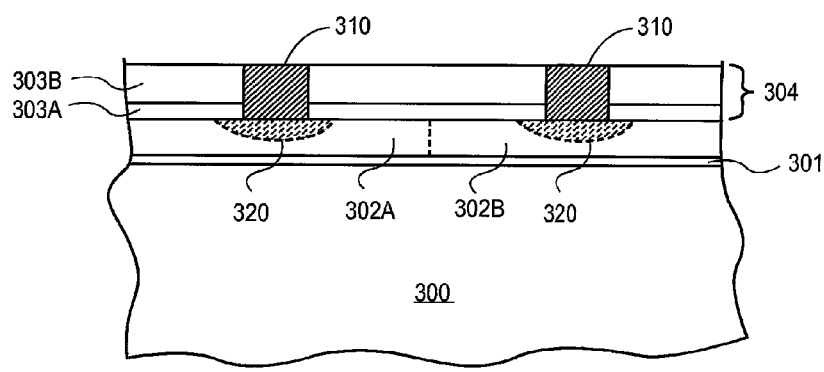
FIG. 3A illustrates a cross-sectional view of a back-contact solar cell, in accordance with an embodiment of the present invention.

Referring to FIG. 3A, a back-contact solar cell 300 includes a poly-crystalline material layer 302A+302B disposed above a single-crystalline substrate 300. A dielectric material stack 304 is disposed above poly-crystalline material layer 302A+302B. A plurality of conductive contacts 310 is disposed in dielectric material stack 304 and coupled directly to a portion of poly-crystalline material layer 302A+302B. A recast poly signature 320 is disposed in poly-crystalline material layer 302A+302B and is in alignment with one of the plurality of conductive contacts 310.

Figure 3B:
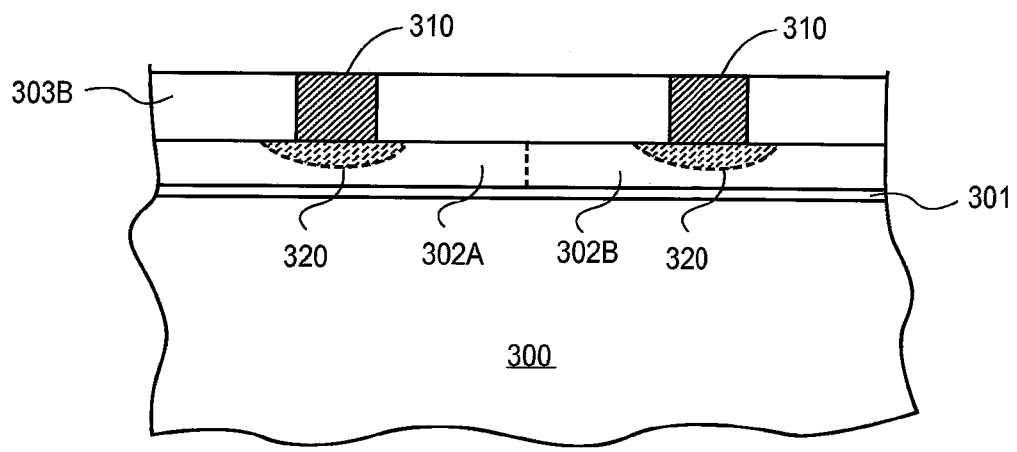
FIG. 3B illustrates a cross-sectional view of a back-contact solar cell, in accordance with another embodiment of the present invention.

In accordance with an embodiment of the present invention, poly-crystalline material layer 302A+302B is a layer of poly-crystalline silicon, and single-crystalline substrate 300 is a single-crystalline silicon substrate. In one embodiment, the layer of poly-crystalline silicon is disposed directly on a dielectric film 301, and dielectric film 301 is disposed directly on single-crystalline silicon substrate 300, as depicted in FIG. 3A. In a specific embodiment, the layer of poly-crystalline silicon includes both N-type and P-type doped regions, 302A+302B, as is also depicted in FIG. 3A. In an embodiment, dielectric material stack 304 includes a silicon dioxide layer 303A disposed directly on poly-crystalline material layer 302A+302B, and a silicon nitride layer 303B disposed directly on silicon dioxide layer 303A, as depicted in FIG. 3A. In one embodiment, silicon dioxide layer 303A has a thickness approximately in the range of 5-15 nanometers. In an embodiment, each of the plurality of conductive contacts 310 is round in shape. In an alternative embodiment, instead of forming poly-crystalline material layer 302A+302B, a non-poly-crystalline absorbing material is formed instead such as, but not limited to an amorphous layer, a polymer layer, or a multi-crystalline layer. In another alternative embodiment, instead of using single-crystalline substrate 300, a multi-crystalline substrate is used in its place. In an embodiment, a trench or gap is present between the P and N diffused regions, e.g., in the case of one embodiment of a back-contact design. In another embodiment, as depicted in FIG. 3B, a single dielectric material 303B with a thickness approximately in the range of 5-15 nanometers is used, and layer 303A is excluded.

Figure 4:
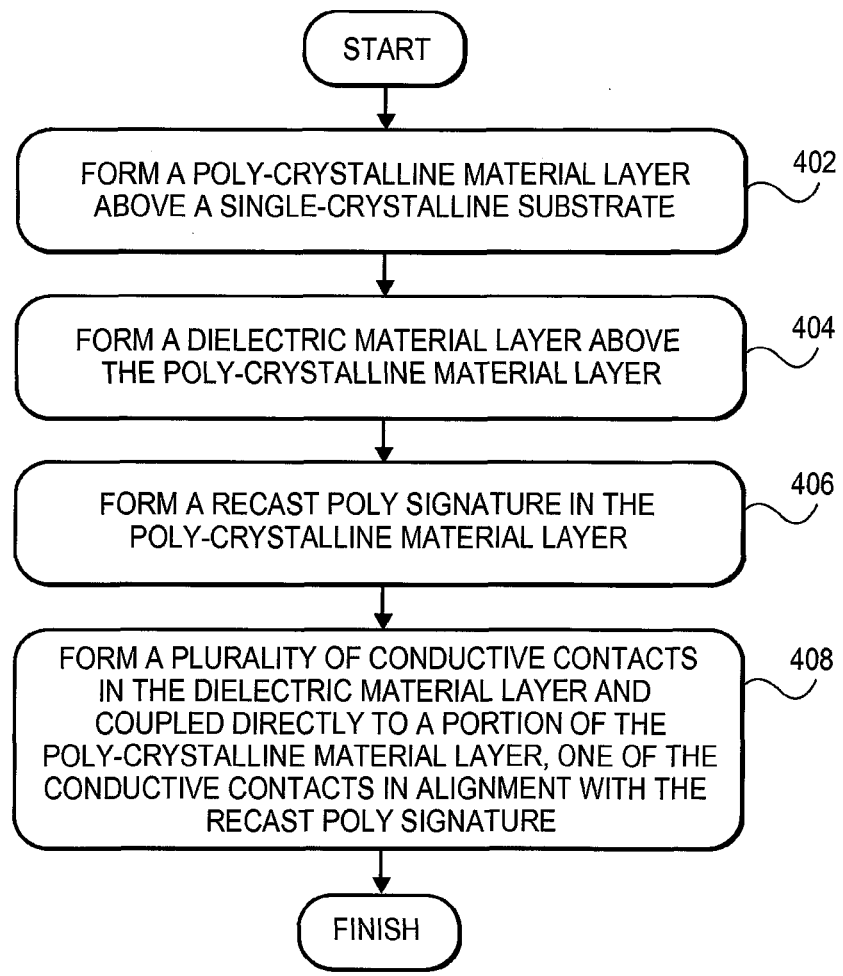
FIG. 4 illustrates a flowchart representing operations in a method of fabricating a back-contact solar cell, in accordance with an embodiment of the present invention.

A back-contact solar cell having a recast poly signature may be formed when contact holes in the back-contact solar cell are formed by a laser ablation process. FIG. 4 illustrates a flowchart 400 representing operations in a method of fabricating a back-contact solar cell, in accordance with an embodiment of the present invention.

Referring to operation 402 of flowchart 400, a method of fabricating a back-contact solar cell includes forming a poly-crystalline material layer above a single-crystalline substrate. In accordance with an embodiment of the present invention, forming the poly-crystalline material layer above the single-crystalline substrate includes forming a layer of poly-crystalline silicon above a single-crystalline silicon substrate. In one embodiment, forming the layer of poly-crystalline silicon above the single-crystalline silicon substrate includes forming the layer of poly-crystalline silicon directly on a dielectric film, the dielectric film formed directly on the single-crystalline silicon substrate, and forming both N-type and P-type doped regions in the layer of poly-crystalline silicon. In an alternative embodiment, instead of forming the poly-crystalline material layer, a non-poly-crystalline absorbing material is formed instead such as, but not limited to an amorphous layer, a polymer layer, or a multi-crystalline layer. In another alternative embodiment, instead of using the single-crystalline substrate, a multi-crystalline substrate is used in its place. In an embodiment, a trench or gap is present between the P and N diffused regions, e.g., in the case of one embodiment of a back-contact design.

Referring to operation 404 of flowchart 400, the method of fabricating a back-contact solar cell also includes forming a dielectric material stack above the poly-crystalline material layer. In accordance with an embodiment of the present invention, forming the dielectric material stack above the poly-crystalline material layer includes forming a silicon dioxide layer directly on the poly-crystalline material layer, and forming a silicon nitride layer directly on the silicon dioxide layer. In one embodiment, forming the silicon dioxide layer includes forming the layer to have a thickness approximately in the range of 1-50 nanometers. In a specific embodiment, forming the silicon dioxide layer includes forming the layer to have a thickness approximately in the range of 5-15 nanometers.

Referring to operation 406 of flowchart 400, the method of fabricating a back-contact solar cell also includes forming a recast poly signature in the poly-crystalline material layer. In accordance with an embodiment of the present invention, each of the plurality of conductive contacts is round in shape.

Referring to operation 408 of flowchart 400, the method of fabricating a back-contact solar cell also includes forming a plurality of conductive contacts in the dielectric material stack and coupled directly to a portion of the poly-crystalline material layer, one of the conductive contacts in alignment with the recast poly signature. In accordance with an embodiment of the present invention, forming the recast poly signature includes ablating with a laser having a wavelength approximately at, or less than, 1064 nanometers.

It is to be understood that use of the term poly-crystalline layer, when referring to a polycrystalline silicon layer, is intended to also cover material that can be described as amorphous- or a-silicon. It is also to be understood that, instead of or in addition to forming N-type and P-type doped regions in the poly-crystalline layer, such regions can instead be formed directly in a single crystalline substrate. It is also to be understood that a variety of laser pulse periodicities may be used for ablation. However, in an embodiment, laser ablation is performed with laser pulse lengths in the pico- to nano-second range.

Thus, the formation of solar cell contacts using a laser has been disclosed. In accordance with an embodiment of the present invention, a method of fabricating a back-contact solar cell includes forming a poly-crystalline material layer above a single-crystalline substrate. A dielectric material stack is formed above the poly-crystalline material layer. A plurality of contacts holes is formed in the dielectric material stack by laser ablation, each of the contact holes exposing a portion of the poly-crystalline material layer. Conductive contacts are formed in the plurality of contact holes. In one embodiment, forming the plurality of contact holes is performed without the use of a patterned mask. In one embodiment, forming the plurality of contact holes includes ablating with a laser having a wavelength approximately at, or less than, 1064 nanometers. In an embodiment, forming the poly-crystalline material layer above the single-crystalline substrate includes forming a layer of poly-crystalline silicon above a single-crystalline silicon substrate.

What is claimed is:

1. A solar cell comprising:
   a silicon substrate;
   a dielectric material above the silicon substrate;
   a poly-crystalline silicon layer above the dielectric material, the polycrystalline layer having alternating P-type and N-type doped regions and a plurality of recast poly signatures;
   a dielectric stack above the poly-crystalline silicon layer;
   a plurality of conductive contacts through the dielectric stack with each of the plurality of conductive contacts being in alignment with one of the plurality of recast poly signatures in the poly-crystalline silicon layer; and wherein the dielectric stack comprises a silicon nitride layer, and wherein the dielectric stack further comprises a silicon dioxide layer between the poly-crystalline silicon layer and the silicon nitride layer.

2. The solar cell of claim 1, wherein the silicon dioxide layer is disposed directly on the poly-crystalline silicon layer and the silicon nitride layer is disposed directly on the silicon dioxide layer.

3. The solar cell of claim 1, wherein the silicon substrate comprises a single crystalline silicon.

4. The solar cell of claim 1, wherein the dielectric material comprises silicon dioxide.

5. The solar cell of claim 4, wherein the poly-crystalline silicon layer is disposed directly on the dielectric material.

6. A solar cell comprising:
   a silicon substrate;
   a poly-crystalline silicon layer above the silicon substrate, the poly-crystalline silicon layer including a first doped region and a first recast poly signature in the first doped region;
   a dielectric film between the silicon substrate and the poly-crystalline silicon layer;
   a first layer of dielectric above the poly-crystalline silicon layer;
   a conductive contact through the first layer of dielectric and in contact with the first doped region, the conductive contact being in alignment with the first recast poly signature in the first doped region; and wherein the solar cell further comprising a second layer of dielectric disposed between the poly-crystalline silicon layer and the first layer of dielectric, wherein the first layer of dielectric comprises silicon nitride.

7. The solar cell of claim 6, wherein the second layer of dielectric comprises silicon dioxide that is disposed directly on the poly-crystalline silicon layer.

8. The solar cell of claim 6, wherein the dielectric film comprises silicon dioxide.

9. The solar cell of claim 6, wherein the poly-crystalline silicon layer further includes a second doped region.

10. A solar cell comprising:
    a silicon substrate;
    a poly-crystalline silicon layer above the silicon substrate;
    a dielectric stack comprising a first layer of dielectric and a second layer of dielectric, the second layer of dielectric being between the poly-crystalline silicon layer and the first layer of dielectric;
    a conductive contact through the dielectric stack, the conductive contact directly contacting a recast poly signature in a first doped region in the poly-crystalline silicon layer; and wherein the first layer of the dielectric stack comprises silicon nitride, and the second layer of the dielectric stack comprises silicon dioxide that is directly disposed on the poly-crystalline silicon layer.

11. The solar cell of claim 10, further comprising a dielectric film directly disposed on the silicon substrate, wherein the poly-crystalline silicon layer is directly disposed on the dielectric film.

12. The solar cell of claim 11, wherein the dielectric film comprises silicon dioxide.

13. The solar cell of claim 10, wherein the first doped region is a P-type doped region and the poly-crystalline silicon layer further includes an N-type doped region.

* * * * *